US008803535B2

(12) United States Patent
Kothandaraman et al.

(10) Patent No.: US 8,803,535 B2
(45) Date of Patent: Aug. 12, 2014

(54) IMPEDANCE MISMATCH DETECTION CIRCUIT

(75) Inventors: Makeshwar Kothandaraman, Bangalore (IN); Pankaj Kumar, Bangalore (IN); Pramod Parameswaran, Bangalore (IN)

(73) Assignee: LSI Corporation, San Jose, CA (US)

( * ) Notice: Subject to any disclaimer, the term of this patent is extended or adjusted under 35 U.S.C. 154(b) by 562 days.

(21) Appl. No.: 13/171,725

(22) Filed: Jun. 29, 2011

(65) Prior Publication Data
US 2013/0002267 A1 Jan. 3, 2013

(51) Int. Cl.
*G01R 27/26* (2006.01)
*H03F 3/45* (2006.01)

(52) U.S. Cl.
CPC .. *H03F 3/45475* (2013.01); *H03F 2203/45594* (2013.01)
USPC ........... 324/679; 324/662; 324/686; 324/649; 326/30; 326/27; 326/86; 326/87

(58) Field of Classification Search
CPC ...... H04L 25/0278; H03H 7/38; H03K 17/16; H03K 19/003; H03K 19/0005; H03F 3/45475; H03F 2003/45594; G01R 27/26
USPC .................... 324/679, 662, 686, 649
See application file for complete search history.

(56) References Cited

U.S. PATENT DOCUMENTS

| | | | |
|---|---|---|---|
| 4,704,573 A | 11/1987 | Turner, Jr. | |
| 2005/0189950 A1* | 9/2005 | Lu | 324/606 |
| 2007/0188187 A1* | 8/2007 | Oliva et al. | 326/30 |
| 2008/0211534 A1* | 9/2008 | Jeong et al. | 326/30 |
| 2009/0167457 A1 | 7/2009 | Melde et al. | |
| 2011/0148470 A1* | 6/2011 | Inoue | 327/77 |

* cited by examiner

*Primary Examiner* — Arleen M Vazquez
*Assistant Examiner* — Son Le
(74) *Attorney, Agent, or Firm* — Otterstedt, Ellenbogen & Kammer, LLP

(57) ABSTRACT

A comparison circuit for detecting impedance mismatch between pull-up and pull-down devices in a circuit to be monitored includes a comparator operative to receive first and second signals and to generate, as an output, a third signal indicative of a difference between the first and second signals. A first signal generator is operative to generate the first signal indicative of a difference between reference pull-up and pull-down currents that is scaled by a prescribed amount. The reference pull-up current is indicative of a current flowing through at least one corresponding pull-up transistor device in the circuit to be monitored. The pull-down reference current is indicative of a current flowing through at least one corresponding pull-down transistor device in the circuit to be monitored. A second signal generator connected with the second input of the comparator is operative to generate the second signal as a reference voltage defining a prescribed impedance mismatch threshold associated with the circuit to be monitored.

20 Claims, 7 Drawing Sheets

IMPEDANCE MISMATCH DETECTION CIRCUIT

FIELD OF THE INVENTION

The present invention relates generally to electronic circuits, and more particularly relates to techniques for detecting impedance mismatch in a circuit.

BACKGROUND OF THE INVENTION

In modern electronic circuits, such as, for example, input/output (IO) buffers, it is desirable to control the relative variation between pull-up and pull-down impedances of the IO buffers for a variety of reasons, including, but not limited to, transmission line matching, minimizing switching noise (e.g., di/dt), optimizing signal swing, etc. In many high-speed, high-bandwidth applications, such as, for example, memory interfacing (e.g., double data rate 3 (DDR3) or DDR4 memory), it is particularly important to control pull-up and pull-down impedances of an interface circuit in such a way that the relative difference between the pull-up and pull-down impedances (i.e., impedance mismatch) is minimized. For example, one Joint Electron Devices Engineering Council (JEDEC) standard requires impedance mismatch in an output driver circuit to be within ten percent (10%) over variations in integrated circuit (IC) process, supply voltage and/or temperature (PVT) conditions to which the circuit may be subjected.

In order to achieve such tight control of impedance variation and pull-up/pull-down impedance mismatch, a buffer, often referred to as a compensated buffer, is typically employed which is adapted to compensate for variations in PVT conditions. In one implementation, a PVT compensated buffer utilizes a compensation circuit including a PVT control block which monitors a deviation in output impedance of a block of one or more reference devices matched to corresponding devices (e.g., drivers) in an output stage of the buffer to be compensated. The PVT control block generates a set of digital bits, often referred to as "PVT bits," that are used to control the reference devices (e.g., by turning the devices on or off) to thereby maintain a substantially constant output impedance. The output impedance of the reference block will be a function of the number of devices in the block that are turned on or off at any given time. These PVT bits are also fed to the buffer for controlling the output impedance of the buffer output stage devices in a corresponding manner. The number of drivers in the buffer output stage is directly proportional to the number of digital control bits.

In the context of metal-oxide-semiconductor (MOS) transistor devices, since p-channel MOS (PMOS) transistor devices and n-channel MOS (NMOS) transistor devices do not generally track one another, pull-up devices, which typically employ PMOS transistors, will generally exhibit a different characteristic spread compared to pull-down devices, which typically employ NMOS transistors. In smaller IC fabrication technologies (e.g., 28 nanometers (nm)), the spread between PMOS and NMOS device characteristics, and correspondingly impedance mismatch, is often exacerbated.

SUMMARY OF THE INVENTION

The present invention, in illustrative embodiments thereof, relates to techniques for accurately detecting mismatch in a circuit, such as, for example, detecting impedance mismatch between pull-up and pull-down devices in a circuit over variations in PVT conditions to which the circuit may be subjected. In an illustrative buffer circuit application, the inventive mismatch detection techniques are performed without increasing the number of bits utilized by a PVT compensation circuit which can otherwise significantly increase the size and corresponding pad capacitance of an output driver stage in the buffer circuit to be compensated. In this manner, design complexity and layout area penalty are significantly reduced compared to alternative impedance mismatch detection methodologies.

In accordance with an embodiment of the invention, a comparison circuit for detecting impedance mismatch between pull-up and pull-down devices in a circuit to be monitored includes a comparator operative to receive first and second signals and to generate, as an output, a third signal indicative of a difference between the first and second signals. A first signal generator is operative to generate the first signal indicative of a difference between reference pull-up and pull-down currents that is scaled by a prescribed amount. The reference pull-up current is indicative of a current flowing through at least one corresponding pull-up transistor device in the circuit to be monitored. The pull-down reference current is indicative of a current flowing through at least one corresponding pull-down transistor device in the circuit to be monitored. A second signal generator connected with the second input of the comparator is operative to generate the second signal as a reference voltage defining a prescribed impedance mismatch threshold associated with the circuit to be monitored.

In accordance with another embodiment of the invention, at least a portion of the comparison circuit for detecting impedance mismatch between pull-up and pull-down devices in a circuit to be monitored is implemented in one or more integrated circuits.

In accordance with yet another embodiment of the invention, an electronic system includes at least one integrated circuit comprising at least one comparison circuit for detecting impedance mismatch between pull-up and pull-down devices in a circuit to be monitored. The at least one comparison circuit includes a comparator operative to receive first and second signals and to generate, as an output of the comparison circuit, a third signal indicative of a difference between the first and second signals. The comparison circuit further includes a first signal generator connected with the first input of the comparator and is operative to generate the first signal indicative of a difference between reference pull-up and pull-down currents that is scaled by a prescribed amount. The reference pull-up current is indicative of a current flowing through at least one corresponding pull-up transistor device in the circuit to be monitored. The reference pull-down current is indicative of a current flowing through at least one corresponding pull-down transistor device in the circuit to be monitored. A second signal generator included in the comparison circuit is connected with the second input of the comparator and is operative to generate the second signal as a reference voltage defining a prescribed impedance mismatch threshold associated with the circuit to be monitored.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
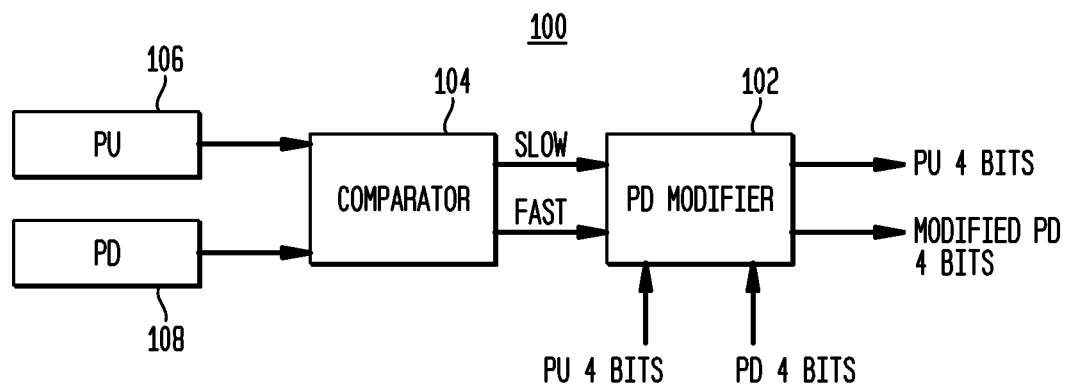
FIG. 1 is a block diagram depicting at least a portion of an exemplary PVT compensation circuit for controlling a mismatch between pull-up and pull-down impedances in a circuit to be compensated, according to an embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The present invention, according to embodiments thereof, will be described herein in the context of illustrative comparator circuits adapted to detect a mismatch between pull-up and pull-down impedances of a circuit over variations in PVT conditions to which the circuit may be subjected. It should be understood, however, that the present invention is not limited to these or any other particular circuit arrangements. Rather, the invention is more generally applicable to techniques for accurately detecting mismatch in a circuit; particularly, by way of example only, detecting a difference between pull-up and pull-down impedances in a circuit in such a way that design complexity, capacitance and layout area penalty are significantly reduced compared to conventional impedance mismatch detection approaches, among other advantages. Moreover, it will become apparent to those skilled in the art given the teachings herein that numerous modifications can be made to the embodiments shown that are within the scope of the present invention. That is, no limitations with respect to the specific embodiments described herein are intended or should be inferred.

For the purpose of describing and claiming the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., MOSFETs), as well as those that do not. In addition, despite a reference to the term "metal" in the acronym MISFET, the term MISFET is also intended to encompass semiconductor field effect transistors wherein the gate is formed from a non-metal such as, for instance, polysilicon.

Although embodiments of the present invention described herein may be implemented using PMOS and NMOS transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

As previously stated, since PMOS and NMOS transistor devices do not generally track one another, pull-up devices, which often employ PMOS transistors, will generally exhibit a different characteristic spread compared to pull-down devices, which often employ NMOS transistors. Accordingly, impedance matching between pull-up and pull-down devices in a circuit will generally be poor, particularly as IC process technology migrates to smaller geometries (e.g., 28 nm). In some instances, depending on the range of PVT conditions to which the circuit is subjected, impedance mismatch between pull-up and pull-down devices in the circuit may fail to meet prescribed design tolerances even when PVT compensation circuitry (e.g., a PVT controller) is utilized. For example, the variation in pull-up and/or pull-down device impedances may be beyond an operational range within which compensation circuitry is able to correct for the impedance mismatch. Although increasing the number of PVT bits used in the PVT compensation circuitry may increase the number of compensation steps available, thereby extending the effective operating range over which the circuit can be compensated, adding more PVT bits has a significant penalty of increasing the size of a driver stage in the circuit (thereby increasing capacitance at an input/output (I/O) pad of the circuit) and increasing design complexity, among other disadvantages.

FIG. 1 is a block diagram depicting at least a portion of an exemplary PVT compensation circuit 100 for controlling a mismatch between pull-up and pull-down impedances in a circuit to be compensated, according to an embodiment of the present invention. Compensation circuit 100 preferably includes a pull-down (PD) modifier circuit 102. Modifier circuit 102 is preferably operative to receive, as inputs, a plurality of digital control bits (e.g., PVT compensation/impedance compensation bits) which, in this illustration, comprises a set of four pull-up (PU) PVT compensation/impedance compensation bits (PU 4 bits) and a set of four PD PVT compensation/impedance compensation bits (PD 4 bits), and to generate, as outputs thereof, the set of four PU PVT compensation/impedance compensation bits and a plurality of modified digital control bits, which may comprise a set of four modified PD PVT compensation/impedance compensation bits (Modified PD 4 bits), as a function of one or more control signals, which may comprise "slow" and "fast" signals, supplied to the modifier circuit.

It is to be understood that the invention is not limited to any particular number of digital control bits. The number of digital control bits used will depend on one or more design criteria, including, but not limited to, a desired granularity (i.e., accuracy) of compensation and the area/complexity penalty tolerated; as the number of control bits increases, the area and complexity of the circuit increase accordingly. Moreover, in this illustrative embodiment, only the PD compensation bits are being modified, although the invention contemplates that, according to alternative embodiments, the PU compensation bits may be modified instead, or both the PU and PD compensation bits can be modified, as will become apparent to those skilled in the art given the teachings herein.

A comparator 104 is preferably operative to generate the slow and fast control signals supplied to PD modifier circuit 102 for controlling a modification of the PD compensation bits. Specifically, comparator 104 monitors an impedance of at least one reference pull-up device 106 and an impedance of at least one reference pull-down device 108 and generates control signals slow and fast based at least in part on a comparison between the respective impedances of the pull-up and pull-down devices. For instance, if comparator 104, in comparing the respective impedances of the pull-up and pull-down devices 106 and 108, respectively, determines that the pull-down devices are slower than the pull-up devices (e.g., PD impedance is greater than PU impedance), the comparator will generate an active slow signal (e.g., logic high or "1") and will generate an inactive fast signal (e.g., logic low or "0"). Conversely, if comparator 104, in comparing the respective impedances of the pull-up and pull-down devices 106 and 108, respectively, determines that the pull-down devices are faster than the pull-up devices (e.g., PD impedance is less than PU impedance), the comparator will generate an active fast signal (e.g., logic high or "1") and will generate an inactive slow signal (e.g., logic low or "0"). If the pull-up and pull-down impedances are substantially the same relative to one another, both the slow and fast control signals will be inactive (e.g., logic low).

The reference pull-up device(s) 106 and reference pull-down device(s) 108 are preferably substantially matched to one or more corresponding devices forming an output stage of a compensated buffer circuit, or an alternative circuit in which impedance mismatch is to be monitored and/or compensated. In this manner, PVT compensation circuit 100 will be able to more accurately compensate for mismatches in impedance between the pull-up and pull-down devices over a prescribed range of PVT conditions to which the circuit may be subjected.

PD modifier circuit 102 utilizes the information conveyed by the control signals slow and fast to adjust the PD compensation bits accordingly. For example, when the slow signal is asserted (i.e., active) and the fast signal is deasserted (i.e., inactive), PD modifier circuit 102 preferably adjusts the PD bits by shifting up the PD bits relative to the PU bits. Alternatively, when the fast signal is asserted and the slow signal is deasserted, PD modifier circuit 102 preferably adjusts the PD bits by shifting down the PD bits relative to the PU bits. In this example, the PU bits remain the same (i.e., unmodified). If neither control signal is asserted, indicating that the respective impedances of the pull-up and pull-down devices are substantially equal to one another, both the PU bits and PD bits remain unchanged. In this manner, the respective impedances of the pull-up and pull-down devices can be beneficially controlled so as to reduce impedance mismatch therebetween.

A design of comparator 104 suitable for achieving pull-up/pull-down impedance mismatch control to within a prescribed tolerance (e.g., ten percent) can present a considerable challenge using the approach depicted in FIG. 1. For example, with reference to FIG. 2, at least a portion of an exemplary comparator circuit 200 is shown which may be utilized for generating at least one control signal (e.g., slow and/or fast control signal) indicative of impedance mismatch between pull-up and pull-down devices in a circuit. Comparator circuit 200 comprises a comparator 202 operative to receive a first voltage, Vm, at a first input, which may be a non-inverting (+) input, and a second voltage, which may be a reference voltage, (VDD/2)+30 millivolts (mV), where VDD is a supply voltage of the circuit, at a second input, which may be an inverting (−) input, and to generate an output signal, Out, indicative of a comparison of the two input voltages. The 30 mV is indicative of a threshold of the mismatch in impedance between the pull-up and pull-down devices 204 and 206, respectively, in an exemplary 28-nm IC fabrication process. This threshold can vary with process technologies. Since, in many applications, there is a prescribed impedance mismatch specification (e.g., JEDEC), the threshold value is preferably selected so that the impedance mismatch specification value is not exceeded. If the actual (i.e., measured) mismatch voltage Vm exceeds VDD/2 by more than 30 mV, comparator 202 will trigger, generating the output signal Out which is indicative of a mismatch condition. The voltage VDD/2 is the potential at which there is ideally no mismatch between pull-up and pull-down impedances in the circuit being monitored.

Voltage Vm is indicative of an impedance mismatch between a reference pull-up device 204 and a reference pull-down device 206. The reference pull-up and pull-down devices 204 and 206, respectively, are preferably connected together in series, such that a first terminal of reference pull-up device 204 is adapted for connection with VDD, a second terminal of the pull-up device is connected to a first terminal of reference pull-down device 206 at node N1 and generates the voltage Vm, and a second terminal of the pull-down device is adapted for connection with VSS, or an alternative voltage source. Reference pull-up device 204 is preferably indicative of one or more corresponding pull-up devices in a circuit (e.g., buffer circuit) to be monitored. Likewise, reference pull-down device 206 is preferably indicative of one or more corresponding pull-down devices in the circuit to be monitored. When a pull-up impedance, Rpu, of reference pull-up device 204 is substantially equal to a pull-down impedance, Rpd, of reference pull-down device 206, voltage Vm will be substantially equal to VDD/2 (assuming VSS is equal to zero volts).

Consider, by way of example only and without loss of generality, an application in which impedance mismatch between pull-up and pull-down devices is specified to be within ten percent (e.g., JEDEC specification). In order to control impedance mismatch to within ten percent, comparator 202 should be able to resolve a difference between the respective voltages across the pull-up and pull-down devices 204, 206 of about 30 millivolts (mV). In the case where a ratio of pull-up resistance Rpu to pull-down resistance Rpd (i.e., Rpu/Rpd) is greater than (VDD/2)+30 mV, comparator 202 will ideally generate an output signal indicative of the pull-down device 206 being slower relative to the pull-up device 204. However, once comparator offset is taken into effect, which is generally on the order of about 15-20 mV, particularly over variations in PVT conditions, comparator 202 may generate an output signal conveying erroneous information. A means for more accurately detecting a difference between pull-up and pull-down impedances in the circuit, even in the presence of comparator offset, is therefore required.

Figure 2:
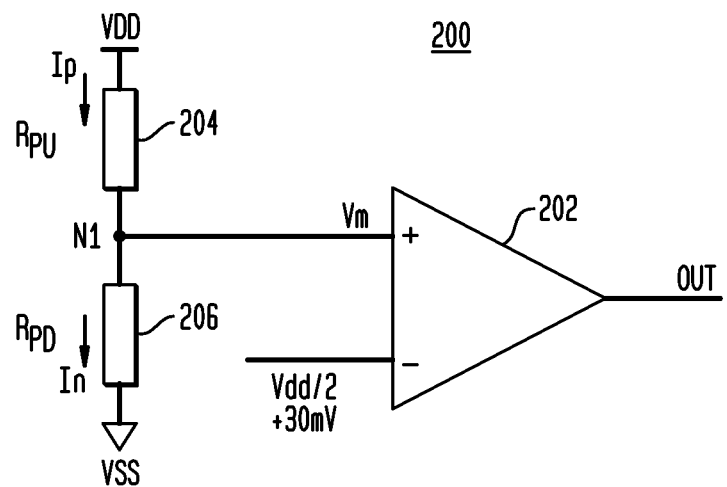
FIG. 2 is a schematic diagram depicting at least a portion of an exemplary comparator circuit suitable for generating at least one control signal indicative of impedance mismatch between pull-up and pull-down devices in a circuit.

With continued reference to FIG. 2, assuming the pull-up and pull-down impedances Rpu and Rpd, respectively, are equal to one another and assuming VSS is equal to zero, the voltage Vm at node N1 will be equal to VDD/2. A mismatch between Rpu and Rpd can be determined by comparing a difference between pull-up current, Ip, and pull-down current, In, which can be defined as follows under the above assumptions:

$$Ip = \frac{VDD/2}{Rpu} = \frac{VDD}{2 \cdot Rpu} \quad (1)$$

$$In = \frac{VDD - \frac{VDD}{2}}{Rpd} = \frac{VDD}{2 \cdot Rpd} \quad (2)$$

As seen from the above expressions, pull-up current Ip is inversely proportional to pull-up resistance Rpu, and pull-down current In is inversely proportional to pull-down resistance Rpd.

Since mismatch, M, can be defined as:

$$M = 2 \times \left[\frac{Rpu - Rpd}{Rpu + Rpd}\right],$$

the following equivalent expression for mismatch may be obtained:

$$M = 2 \times \left[\frac{Rpu - Rpd}{Rpu \cdot Rpd}\right] \times \left[\frac{Rpu \cdot Rpd}{Rpu + Rpd}\right] \quad (3)$$

$$= 2 \times \left[\frac{1}{Rpd} - \frac{1}{Rpu}\right] \times \left[\frac{Rpu}{Rpd}\right]$$

$$M = 2 \cdot Ipn \cdot Rpn,$$

where Ipn represents a difference between the pull-up and pull-down currents, which are inversely proportional to their respective resistances, and Rpn represents a parallel combination of pull-up and pull-down impedances (resistance). The original expression for mismatch M shown above may be derived from the JEDEC specification for $RON_{NOM}$, which can be taken as an average of Rpu and Rpd (i.e., [Rpu+Rpd]/2). Equation (3) above may be implemented in various ways, illustrative embodiments of which will be described in further detail below in conjunction with FIGS. 3 through 7. It is to be appreciated, however, that the invention is not limited to the specific circuit arrangements shown, and that other circuit configurations for implementing techniques of the present invention are similarly contemplated, as will become apparent to those skilled in the art given the teachings herein.

Figure 3:
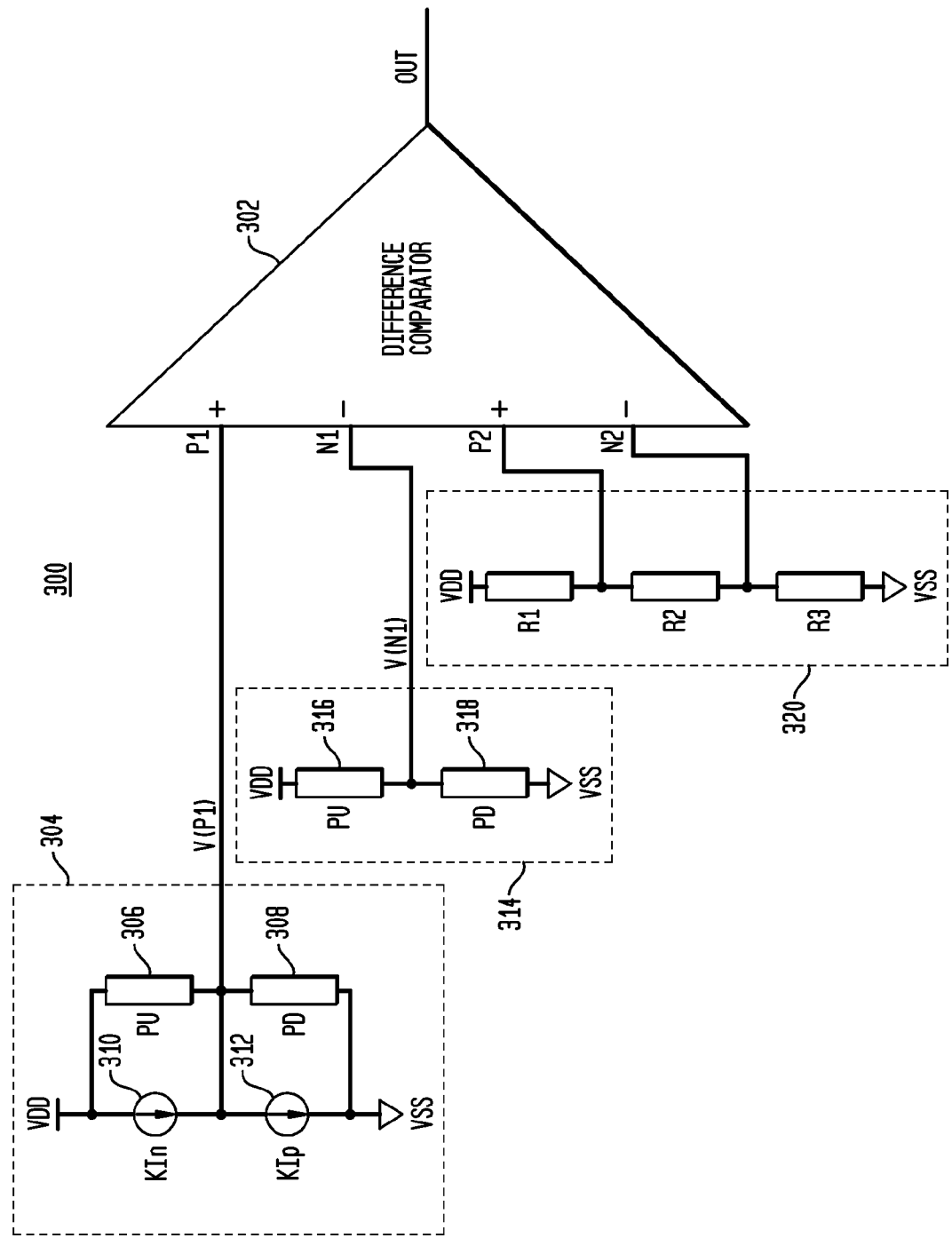
FIG. 3 is a schematic diagram depicting at least a portion of an exemplary comparison circuit, according to an embodiment of the present invention.

FIG. 3 is a schematic diagram depicting at least a portion of an exemplary comparison circuit 300, according to an embodiment of the invention. Comparison circuit 300 seeks to eliminate, or substantially reduce, errors introduced into the pull-up/pull-down impedance comparison result that are primarily attributable to comparator offset. More particularly, comparison circuit 300 includes a difference comparator 302 adapted to receive two sets of differential input signals and to generate an output signal, Out, indicative of a difference therebetween.

Comparison circuit 300 preferably includes a first voltage generator circuit 304 connected with a first input of difference comparator 302, which may be a first non-inverting (+) input, at node P1. Voltage generator circuit 304 includes at least one reference pull-up device (PU) 306 and at least one reference pull-down device (PD) 308 connected together in series between a first voltage source, which may be VDD, and a second voltage source, which may be VSS or ground. Specifically, a first node of pull-up device 306 is adapted for connection with VDD, a second node of the pull-up device is connected with a first node of pull-down device 308 at node P1, and a second node of the pull-down device is adapted for connection with VSS. Reference pull-up device 306 is indicative of one or more corresponding pull-up devices in a circuit (e.g., buffer circuit) to be monitored; pull-up device 306 preferably tracks at least one operating characteristic of the one or more corresponding pull-up devices in the circuit to be monitored. Likewise, reference pull-down device 308 is preferably indicative of one or more corresponding pull-down devices in the circuit to be monitored; pull-down device 308 preferably tracks at least one operating characteristic of the one or more corresponding pull-down devices in the circuit to be monitored.

First voltage generator circuit 304 further includes a first current source 310 operative to generate a first current, which may be a pull-down reference current, KIn, and a second current source 312 operative to generate a second current, which may be a pull-up reference current, KIp, where K is a current scaling factor. First current source 310 is preferably connected in parallel with pull-up device 306 and second current source 312 is connected in parallel with pull-down device 308. Reference pull-up current KIp and reference pull-down current KIn may be generated, for example, using corresponding current mirror circuits described in further detail below in conjunction with FIGS. 4A and 4B, although alternative current generation means are similarly contemplated.

Comparison circuit 300 further comprises a second voltage generator circuit 314 connected with a second input of difference comparator 302, which may be a first inverting (−) input, at node N1. Voltage generator circuit 314 includes at least one reference pull-up device (PU) 316 and at least one reference pull-down device (PD) 318 connected together in series between VDD and VSS. Specifically, a first node of pull-up device 316 is adapted for connection with VDD, a second node of the pull-up device is connected with a first node of pull-down device 318 at node N1, and a second node of the pull-down device is adapted for connection with VSS. Reference pull-up device 316 is indicative of one or more corresponding pull-up devices in the circuit to be monitored; pull-up device 316 preferably tracks at least one operating characteristic of the one or more corresponding pull-up devices in the circuit to be monitored. Likewise, reference pull-down device 318 is preferably indicative of one or more corresponding pull-down devices in the circuit to be monitored; pull-down device 318 preferably tracks at least one operating characteristic of the one or more corresponding pull-down devices in the circuit to be monitored.

The second set of differential inputs of difference comparator 302, namely, input P2, which may be a second non-inverting input, and input N2, which may be a second inverting input, are preferably connected with a reference voltage source 320. Reference voltage source 320 may comprise, for example, a simple resistor divider as shown, although alternative reference voltage generation means are similarly contemplated. For example, in other embodiments of the invention, reference voltage source 320 may comprise a programmable voltage source.

More particularly, reference voltage source 320, in this embodiment, comprises first, second and third resistors, R1, R2 and R3, respectively, or alternative resistive elements, connected together in series between VDD and VSS. Specifically, a first terminal of resistor R1 is adapted for connection with VDD, a second terminal of R1 is connected with resistor R2 at node P2, a second terminal of R2 is connected with a first terminal of resistor R3 at node N2, and a second terminal of R3 is adapted for connection with VSS. Assuming VSS is zero, a voltage V(P2) generated at node P2 will be equal to $$\frac{VDD \cdot (R2 + R3)}{R1 + R2 + R3},$$

and a voltage V(N2) generated at node N2 will be equal to $$\frac{VDD \cdot R3}{R1 + R2 + R3}.$$

Because of the differential configuration of difference comparator 302, a voltage across the first set of differential inputs, P1 and N1, will be equal to V(P1)–V(N1), which, assuming pull-up device 306 is substantially matched to pull-up device 316, and assuming pull-down device 308 is substantially matched to pull-down device 318, can be determined using equations (1) through (3) above as follows:

$$KIn = K \cdot \frac{VDD}{2 \cdot Rpd} \qquad (4)$$

$$KIp = K \cdot \frac{VDD}{2 \cdot Rpu}$$

$$Ipn, 1 = K \cdot \frac{VDD}{2}\left[\frac{1}{Rpd} - \frac{1}{Rpu}\right]$$

$$Rpn, 1 = \frac{Rpu \cdot Rpd}{Rpu + Rpd}$$

$$V(P1) = K \cdot VDD \cdot \frac{M}{4} + VDD \cdot \frac{Rpd}{Rpu + Rpd}$$

$$V(N1) = VDD \cdot \frac{Rpd}{Rpu + Rpd}$$

$$V(P1) - V(N1) = K \cdot VDD \cdot \frac{M}{4},$$

where K is the current scaling ratio as previously described and M is mismatch as defined in equation (3) above.

With continued reference to FIG. 3, the voltage V(P1) in equation (4) above is a combination of two voltage components by superposition principle: one voltage component is due to a difference between currents KIn and KIp flowing through equivalent impedances PU and PD (e.g., Rpu, Rpd), respectively; and a second voltage component is a Thevenin equivalent voltage due to the PU and PD impedances. More particularly, $$V(P1) = K \cdot Ipn \cdot Rpn + VDD \cdot \frac{Rpd}{Rpu + Rpd},$$

where Ipn=In–Ip and Rpn=(Rpu·Rpd)/(Rpu+Rpd). Therefore, it follows that $$V(P1) = K(In - Ip) \cdot \frac{Rpu \cdot Rpd}{Rpu + Rpd} + VDD \cdot \frac{Rpd}{Rpu + Rpd}.$$

Derivations for In and Ip were previously provided in equations (1) and (2) above.

Similarly, a voltage across the second set of differential inputs, P2 and N2, will be equal to V(P2)–V(N2), which can be determined as follows:

$$V(P2) - V(N2) = \frac{VDD \cdot R2}{R1 + R2 + R3}$$

As apparent from equation (4) above, K can be scaled precisely, for example by controlling a current mirror ratio, so that the quantity V(P1)–V(N1) is scaled by a prescribed amount. By amplifying the difference voltage to be detected, the contribution due to comparator offset is beneficially minimized.

By way of example only and without loss of generality, assuming a mismatch between pull-up and pull-down voltages to be about 30 mV, K can be set to a value of eight so as to generate a magnified difference voltage V(P1)–V(N1) of about 240 mV. In this manner, since the magnified difference voltage (e.g., about 240 mV) is substantially greater than the comparator offset voltage (e.g., about 15-20 mV), any error due to comparator offset would be essentially eliminated.

With respect to the 30 mV threshold previously described, this represents the voltage equivalent of the mismatch threshold being detected. Since 30 mV was smaller compared to the real random offsets of the comparator, the detected voltage was beneficially scaled. This is possible if the mismatch is scaled proportionately, according to aspects of the invention. With regard to inputs P2 and N2 of differential comparator 302, the voltage V(P2–N2) represents the threshold above which the comparator output (Out) will trigger. This threshold is preferably selected so as to ensure that the measured impedance mismatch at inputs P1–N1 is within a prescribed specification.

Figure 4A:
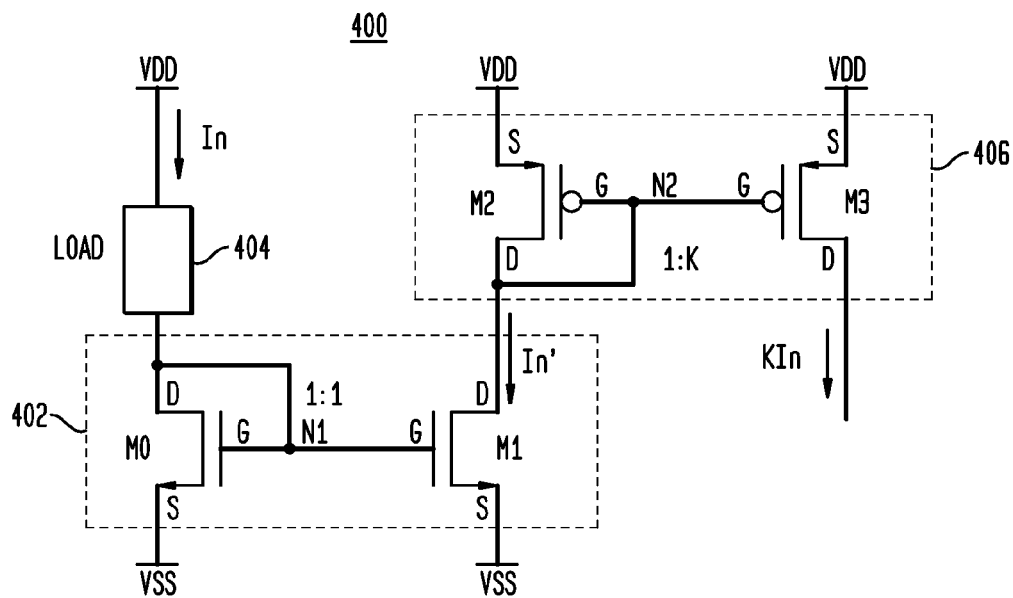
FIG. 4A is a schematic diagram depicting at least a portion of an exemplary current generator circuit for generating a reference pull-down current suitable for use with the comparison circuit shown in FIG. 3.

With reference to FIG. 4A, at least a portion of an exemplary current generator circuit 400 is shown for generating the reference pull-down current KIn suitable for use with the comparison circuit 300 depicted in FIG. 3. Current generator circuit 400 preferably comprises a first current mirror (N-current mirror) 402 operative to replicate a reference current In flowing through a load 404, which may comprise a resistor, connected with the first current mirror. Specifically, current mirror 402 preferably comprises first and second NMOS transistor devices, M0 and M1, respectively. Sources (S) of NMOS devices M0 and M1 are preferably adapted for connection with a first voltage source, which may be VSS or ground, a gate (G) of M1 is connected with a gate and a drain (D) of M0 at node N1, and a drain of M1 forms an output of the first current mirror 402 at node N2. Load 404 includes a first terminal adapted for connection with a second voltage source, which may be VDD, and a second terminal connected with the first current mirror 402 at node N1. Device M0 is connected in a diode configuration, with a value of reference current In being a function of a voltage at node N1 and a resistance of load 404.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

Since the gates of transistors M0 and M1 are connected together and the sources of M0 and M1 are connected together, the gate-to-source voltage across each transistor M0 and M1 will be the same. Consequently, assuming the drain voltages of transistors M0 and M1 are substantially the same relative to one another and assuming M0 and M1 are substantially matched relative to one another (e.g., in terms of device size (channel width/length ratio), IC process characteristics, etc.), currents In and In' generated by M0 and M1, respectively, will be substantially equal. Alternative methods for replicating the reference current In are similarly contemplated. Furthermore, assuming transistors M0 and M1 are substantially matched with corresponding pull-down transistor devices in a circuit to be monitored, reference current In will closely track pull-down current in the circuit over variations in PVT conditions to which the circuit may be subjected.

The current In' is replicated using a second current mirror (P-current mirror) 406 comprising first and second PMOS transistor devices, M2 and M3, respectively. Transistor M2, which is connected with first current mirror 402, is preferably connected in a diode configuration. Specifically, sources of devices M2 and M3 are preferably adapted for connection with VDD, a gate and a drain of M2 are connected with the drain of transistor M1 at node N2, a gate of M3 is connected with the gate of M2 at node N2, and a drain of M3 forms an output of the second current mirror 406 for generating an output current, KIn. The current KIn generated by second current mirror 406 is preferably a scaled version of current In' (and thus reference current In) generated by first current mirror 402, where K is a current scaling factor. The current scaling factor K may be indicative of, for example, a ratio of a size of transistor M2 (e.g., channel width/channel length) to a size of transistor M3. When transistors M2 and M3 are identical to one another, the current scaling factor K would be equal to one. Likewise, when transistor M3 is twice the size of transistor M2, the current scaling factor K would be equal to two, and thus the output current generated by current mirror 406 in this instance would be equal to 2·In.

It is to be understood that the invention is not limited to any specific current scaling value. Furthermore, it is to be appreciated that pull-down current scaling is not limited to a single current mirror (e.g., current mirror 406). Rather, current scaling can be achieved in current mirror 402 and/or current mirror 406, as will become apparent to those skilled in the art. For example, to achieve a current scaling factor K of 9, both current mirrors 402 and 406 can be configured to scale current by 3, or current mirror 402 can be configured to scale current by 9 and current mirror 406 configured to scale current by one (i.e., no scaling), or any other combination of current scaling distributed between the two current mirrors 402, 406 configured to achieve an overall desired current scaling factor. Moreover, although the pull-down current generation path includes only two current mirrors in current generator circuit 400, a similar approach to scaling the pull-down current can be applied when more than two current mirrors are used.

Figure 4B:
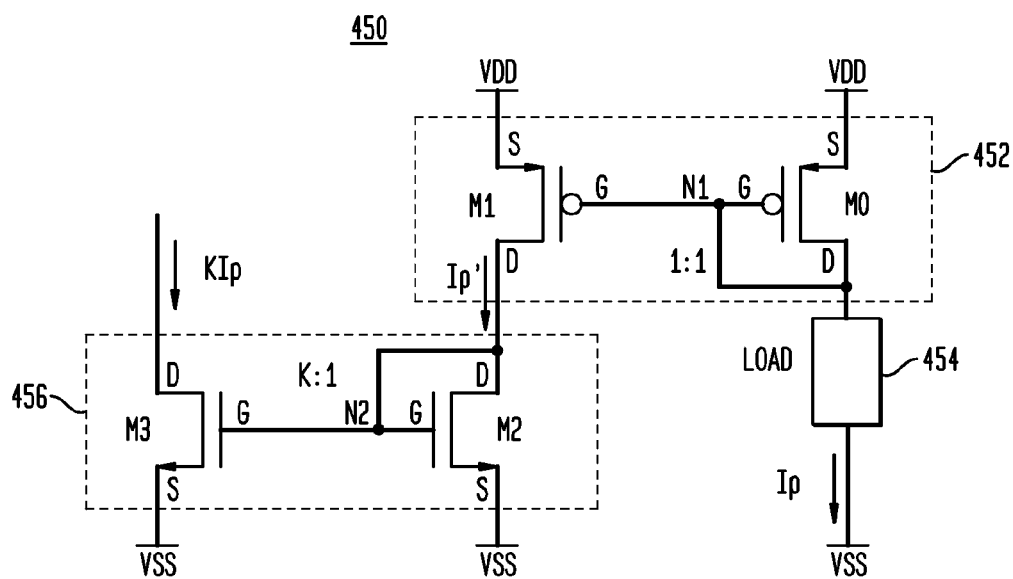
FIG. 4B is a schematic diagram depicting at least a portion of an exemplary current generator circuit for generating a reference pull-up current suitable for use with the comparison circuit shown in FIG. 3.

Pull-up current KIp can be generated in a manner consistent with that depicted in FIG. 4B. With reference now to FIG. 4B, at least a portion of an exemplary current generator circuit 450 is shown for generating the reference pull-up current KIp suitable for use with the comparison circuit 300 depicted in FIG. 3. Current generator circuit 450 preferably comprises a first current mirror (P-current mirror) 452 operative to replicate a reference current Ip flowing through a load 454, which may comprise a resistor, connected with the first current mirror. Specifically, current mirror 452 preferably comprises first and second PMOS transistor devices, M0 and M1, respectively. Sources of transistors M0 and M1 are preferably adapted for connection with a first voltage source, which may be VDD, a gate of M1 is connected with a gate and drain of M0 at node N1, and a drain of M1 forms an output of the first current mirror 452 at node N2. Load 454 includes a first terminal adapted for connection with a second voltage source, which may be VSS or ground, and a second terminal connected with the first current mirror 452 at node N1. Device M0 is connected in a diode configuration, with a value of reference current Ip being a function of a voltage at node N1 and a resistance of load 454.

Since the gates of transistors M0 and M1 are connected together and the sources of M0 and M1 are connected together, the gate-to-source voltage across each transistor M0 and M1 will be the same. Consequently, assuming the drain voltages of transistors M0 and M1 are substantially the same relative to one another and assuming M0 and M1 are substantially matched relative to one another (e.g., in terms of device size, IC process characteristics, etc.), currents Ip and Ip' generated by M0 and M1, respectively, will be substantially equal. Alternative methods for replicating the reference current Ip are similarly contemplated. Furthermore, assuming transistors M0 and M1 are substantially matched with corresponding pull-up transistor devices in the circuit to be monitored, reference current Ip will closely track pull-up current in the circuit over variations in PVT conditions to which the circuit may be subjected.

The current Ip' is replicated using a second current mirror (N-current mirror) 456 comprising first and second NMOS transistor devices, M2 and M3, respectively. Transistor M2, which is connected with first current mirror 452, is preferably connected in a diode configuration. Specifically, sources of devices M2 and M3 are preferably adapted for connection with VSS, a gate and a drain of M2 are connected with the drain of transistor M1 at node N2, a gate of M3 is connected with the gate of M2 at node N2, and a drain of M3 forms an output of the second current mirror 456 for generating an output current, KIp. The current KIp generated by second current mirror 456 is preferably a scaled version of current Ip' (and thus reference current Ip) generated by first current mirror 452, where K is a current scaling factor. The current scaling factor K may be indicative of, for example, a ratio of a size of transistor M2 (e.g., channel width/channel length) to a size of transistor M3. Thus, when transistors M2 and M3 are identical to one another, the current scaling factor K would be equal to one. When transistor M3 is twice the size of transistor M2, the current scaling factor K would be equal to two, and the output current generated by current mirror 456 in this instance would be equal to 2·Ip.

It is to be understood that the invention is not limited to any specific current scaling value. Furthermore, it is to be appreciated that, as in the case of pull-down current scaling described above, pull-up current scaling is not limited to a single current mirror (e.g., current mirror 456); rather, current scaling can be achieved in current mirror 452 and/or current mirror 456, as will become apparent to those skilled in the art. Moreover, although the pull-down current generation path includes only two current mirrors in current generator circuit 450, a similar approach to scaling the pull-up current can be applied when more than two current mirrors are used.

Figure 5:
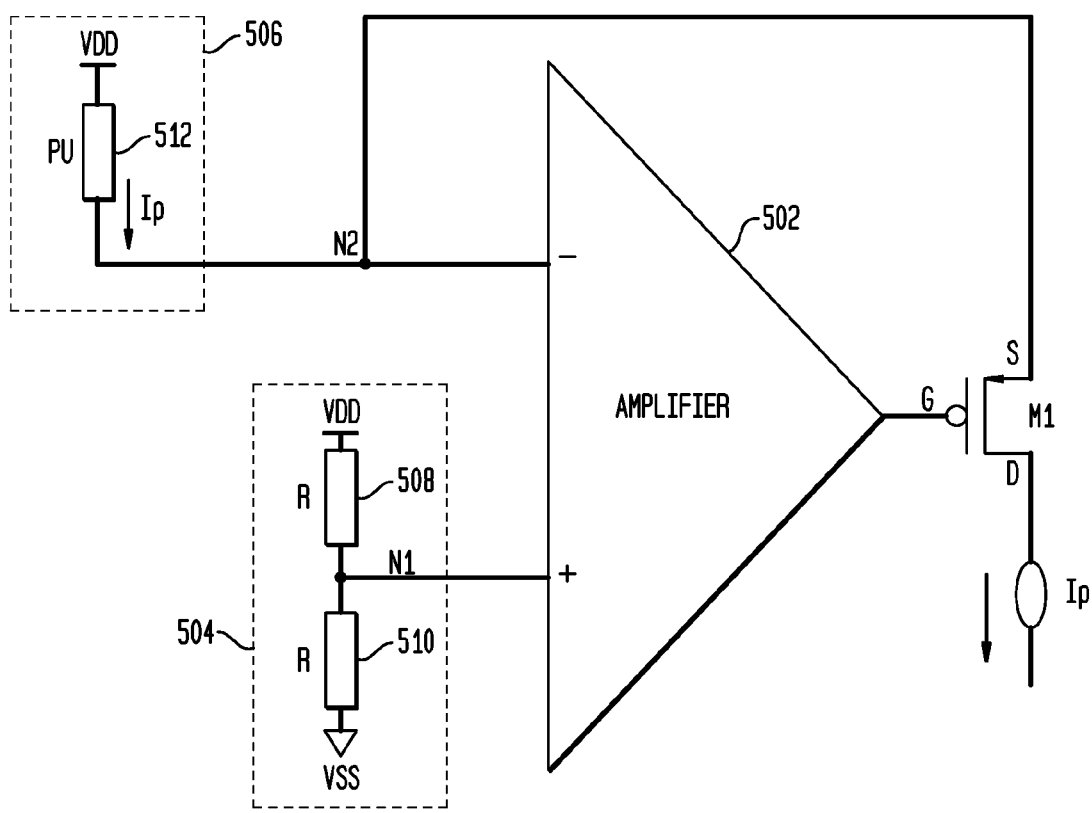
FIG. 5 is a schematic diagram depicting at least a portion of an exemplary current generator circuit operative to generate a reference pull-up current, according to an embodiment of the present invention.

FIG. 5 is a schematic diagram depicting at least a portion of an exemplary current generator circuit 500 operative to generate a reference pull-up current, Ip, according to an embodiment of the invention. Reference current Ip may be used in conjunction with the current generator circuit 400 shown in FIG. 4 for generating the scaled reference pull-up current KIp. As apparent from FIG. 5, current generator circuit 500 preferably includes a differential amplifier 502 having a first input, which may be non-inverting (+) input, connected with a first voltage source 504 at node N1, a second input, which may be an inverting (−) input, connected with a reference transistor device 506 at node N2, and an output operative to generate a control signal adapted to control a value of the pull-up reference current Ip as a function of the respective voltages at the two inputs of the amplifier.

First voltage source 504 is preferably adapted to generate a voltage which is about midway between the two supply voltages, VDD and VSS in this illustration. Voltage source 504 may be implemented as a simple resistor divider comprising first and second resistors, 508 and 510, respectively, connected together in series between VDD and VSS. Assuming VSS is zero and the values of resistors 508 and 510 are substantially the same (R), the voltage at node N1 will be about VDD/2. Reference transistor device 506, which may include one or more PMOS transistor devices 512 connected, for example, in a configuration which is preferably indicative of an operation of one or more corresponding pull-up transistor devices in a circuit to be monitored for impedance mismatch (which is similar to a corresponding device used, for example, in the circuit whose impedance is to be controlled) over variations in PVT conditions to which the circuit may be subjected.

The current generator circuit 500 further includes a PMOS transistor device, M1, connected with the output of amplifier 502 in a feedback arrangement. Specifically, a gate of transistor M1 is connected with the output of amplifier 502 and operative to receive the control signal generated by the amplifier, a source of M1 is connected with the inverting input of the amplifier at node N2, and a drain of M1 is operative to generate the reference pull-up current Ip. With the amplifier 502 configured in this manner, the voltage at node N2 will be substantially equal to the reference voltage at node N1 (e.g., VDD/2) and a current, Ip, flowing through the reference pull-up device 512 will be replicated at the drain of transistor M1. This reference pull-up current Ip can be scaled using the exemplary current mirror arrangement depicted in FIG. 4B. It is to be understood, however, that other reference current generation schemes are similarly contemplated in various alternative embodiments of the invention.

Moreover, although only a reference pull-up current Ip is generated by the illustrative circuit 500 shown in FIG. 5, this circuit can be easily modified to generate a reference pull-down current, In, in a similar manner, as will become apparent to those skilled in the art. For example, the reference transistor device 506 may include one or more NMOS transistor devices connected, for example, in a configuration which is preferably indicative of an operation of one or more corresponding pull-down transistor devices in a circuit to be monitored for impedance mismatch (which is similar to a corresponding device used, for example, in the circuit whose impedance is to be controlled) over variations in PVT conditions to which the circuit may be subjected. Transistor M1 may be replaced by an NMOS transistor device having a gate connected the output of amplifier 502, a source connected with the inverting input of the amplifier, and a drain operative to generate the reference pull-down current In.

Figure 6:
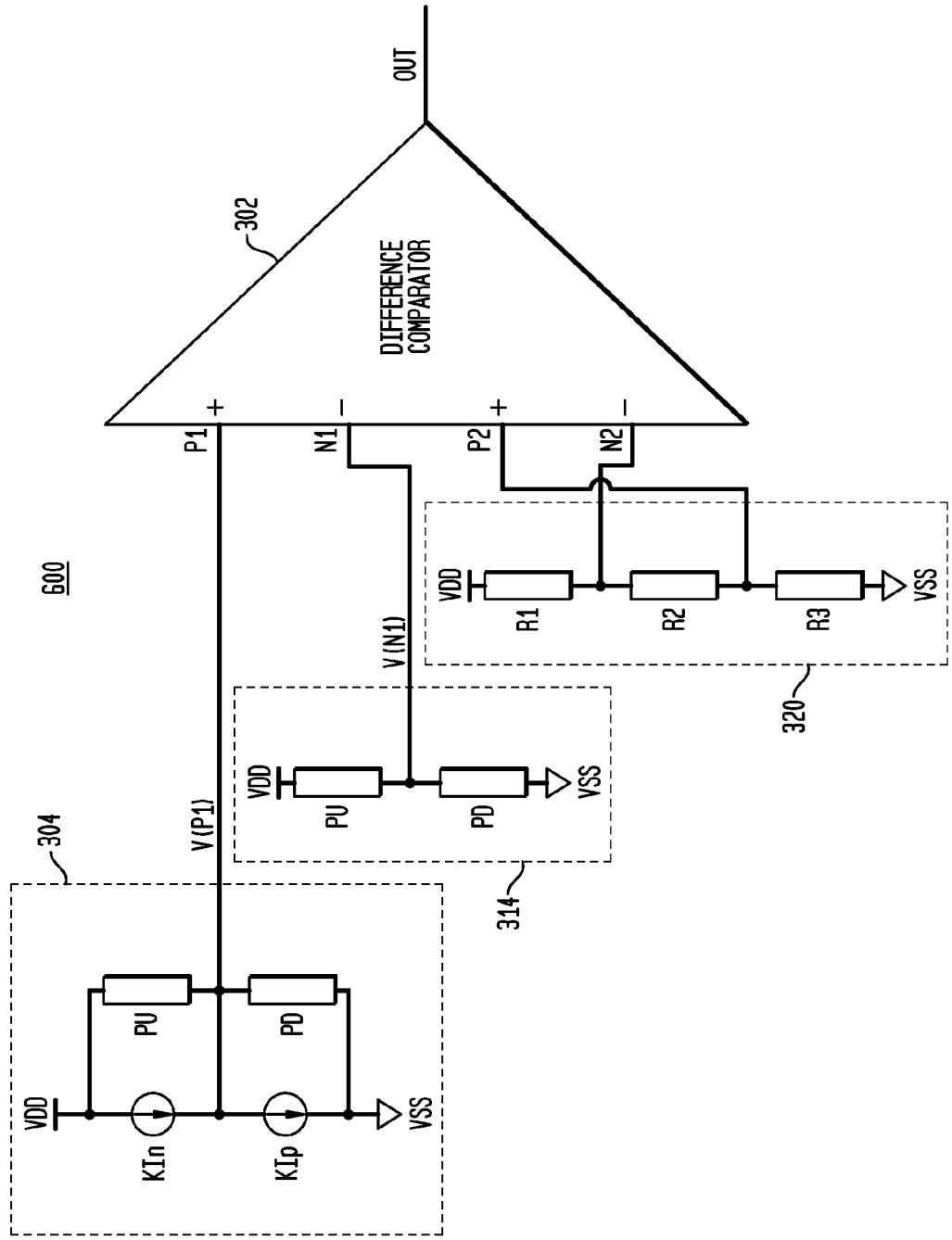
FIG. 6 is a schematic diagram depicting at least a portion of an exemplary comparison circuit, according to an embodiment of the present invention.

FIG. 6 is a schematic diagram depicting at least a portion of an exemplary comparison circuit 600, according to another embodiment of the invention. Comparison circuit 600 is essentially the same as comparison circuit 300 shown in FIG. 3, except that the polarity of the reference voltage used for the second set of differential inputs, P2 and N2, of difference comparator 302 are reversed. More particularly, the second set of differential inputs of difference comparator 302, namely, input P2, which may be a second non-inverting input, and input N2, which may be a second inverting input, are preferably connected with reference voltage source 320. Reference voltage source 320, in this embodiment, is configured such that a first terminal of resistor R1 is adapted for connection with VDD, a second terminal of R1 is connected with resistor R2 at node N2, a second terminal of R2 is connected with a first terminal of resistor R3 at node P2, and a second terminal of R3 is adapted for connection with VSS.

Assuming VSS is zero, a voltage V(P2) generated at node P2 will be equal to $$\frac{VDD \cdot R3}{R1 + R2 + R3},$$

and a voltage V(N2) generated at node N2 will be equal to $$\frac{VDD \cdot (R2 + R3)}{R1 + R2 + R3}.$$

Thus, the voltage across the second set of differential inputs P2, N2 will be determined as follows:

$$V(P2) - V(N2) = \frac{VDD \cdot R3}{R1 + R2 + R3} - \frac{VDD \cdot (R2 + R3)}{R1 + R2 + R3}$$

$$V(P2) - V(N2) = -VDD \cdot \frac{R2}{R1 + R2 + R3}$$

As seen from the above equation, the reference voltage used for the second set of differential inputs to difference comparator 302 is negative. Comparison circuit 600 is thus suitable for use when the mismatch between pull-up and pull-down devices is negative.

Figure 7:
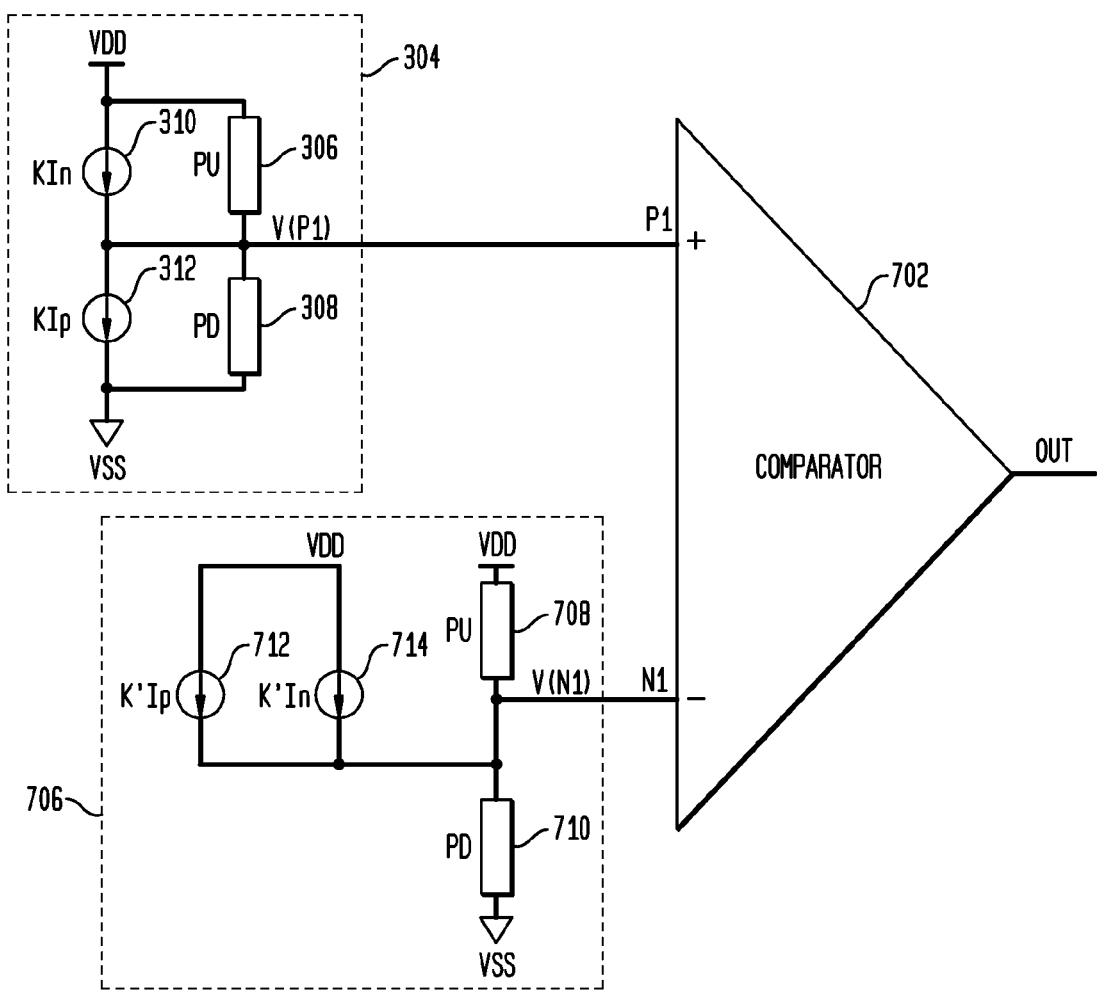
FIG. 7 is a schematic diagram depicting at least a portion of an exemplary comparison circuit, according to another embodiment of the present invention.

With reference now to FIG. 7, a schematic diagram depicts at least a portion of an exemplary comparison circuit 700, according to an embodiment of the invention. Comparison circuit 700 includes a comparator 702 having a first input, which may be a non-inverting (+) input, connected with a first voltage generator circuit 304 at node P1, a second input, which may be an inverting (−) input, connected with a second voltage generator circuit 706 at node N1, and an output for generating an output signal, Out, indicative of a comparison between a voltage, V(P1), present at the first input and a voltage, V(N1), present at the second input. Comparator 702, in contrast to comparator 302 shown in FIG. 3, is not a difference comparator and hence does not require two sets of inputs for generating a comparison output signal, which may beneficially reduce the size of the circuit and simplify the circuit architecture.

First voltage generator circuit 304 in comparison circuit 700 is preferably the same as the circuit used to generate voltage V(P1) in the comparison circuit 300 shown in FIG. 3, although the invention is not limited to the specific circuit arrangement shown. Second voltage generator circuit 706 preferably includes at least one reference pull-up device (PU) 708 and at least one reference pull-down device (PD) 710 connected together in series between VDD and VSS. Specifically, a first node of pull-up device 708 is adapted for connection with VDD, a second node of the pull-up device is connected with a first node of pull-down device 710 at node N1, and a second node of the pull-down device is adapted for connection with VSS. Reference pull-up device 708 is indicative of one or more corresponding pull-up devices in the circuit to be monitored; pull-up device 708 preferably tracks at least one operating characteristic of the one or more corresponding pull-up devices in the circuit to be monitored. Likewise, reference pull-down device 710 is preferably indicative of one or more corresponding pull-down devices in the circuit to be monitored; pull-down device 710 preferably tracks at least one operating characteristic of the one or more corresponding pull-down devices in the circuit to be monitored.

Second voltage generator circuit 706 further comprises a first current source 712 operative to generate a first current, which may be a pull-up reference current, K'Ip, and a second current source 714 operative to generate a second current, which may be a pull-down reference current, K'In, where K' is a current scaling factor which may or may not be different than current scaling factor K used in the first voltage generator circuit 304. First and second current sources 712 and 714, respectively, are preferably connected in parallel with pull-up device 708. Reference pull-up current K'Ip and reference pull-down current K'In may be generated, for example, using corresponding reference current generator circuits, an example of which were described above in conjunction with FIGS. 4A, 4B and 5, although alternative current generation means are similarly contemplated.

As derived earlier in conjunction with FIG. 3, the voltage V(P1) may be determined as follows:

$$V(P1) = K \cdot VDD \cdot \frac{M}{4} + VDD \cdot \frac{Rpd}{Rpu + Rpd},$$

where, as previously defined, Rpu represents pull-up impedance, Rpd represents pull-down impedance, and M represents impedance mismatch. Likewise, the voltage V(N1) may be determined as follows:

$$V(N1) = K' \cdot VDD + VDD \cdot \frac{Rpd}{Rpu + Rpd},$$

where K' is a current scaling which may or may not be different than current scaling factor K, as previously stated. Thus, output signal Out generated by comparator 702 will be indicative of:

$$\text{Out} = V(P1) - V(N1) = K \cdot VDD \cdot \frac{M}{4} - K' \cdot VDD$$

$$\text{Out} = VDD\left[K \cdot \frac{M}{4} - K'\right]$$

By proper selection of the current scaling factor(s) K and/or K', comparison circuit 700 can be utilized to generate an impedance mismatch signal (Out) without error even in the presence of inherent comparator offset. Both scaling factors K and K' can preferably be adjusted to obtain the desired difference, but it is scaling factor K which allows scaling (e.g., amplification) of the mismatch M; K' is used in defining the reference voltage against which the measured mismatch signal is compared. Here, M is measured using the derivation in equation (3) above, which refers to the mismatch between Rpu and Rpd.

Figure 8:
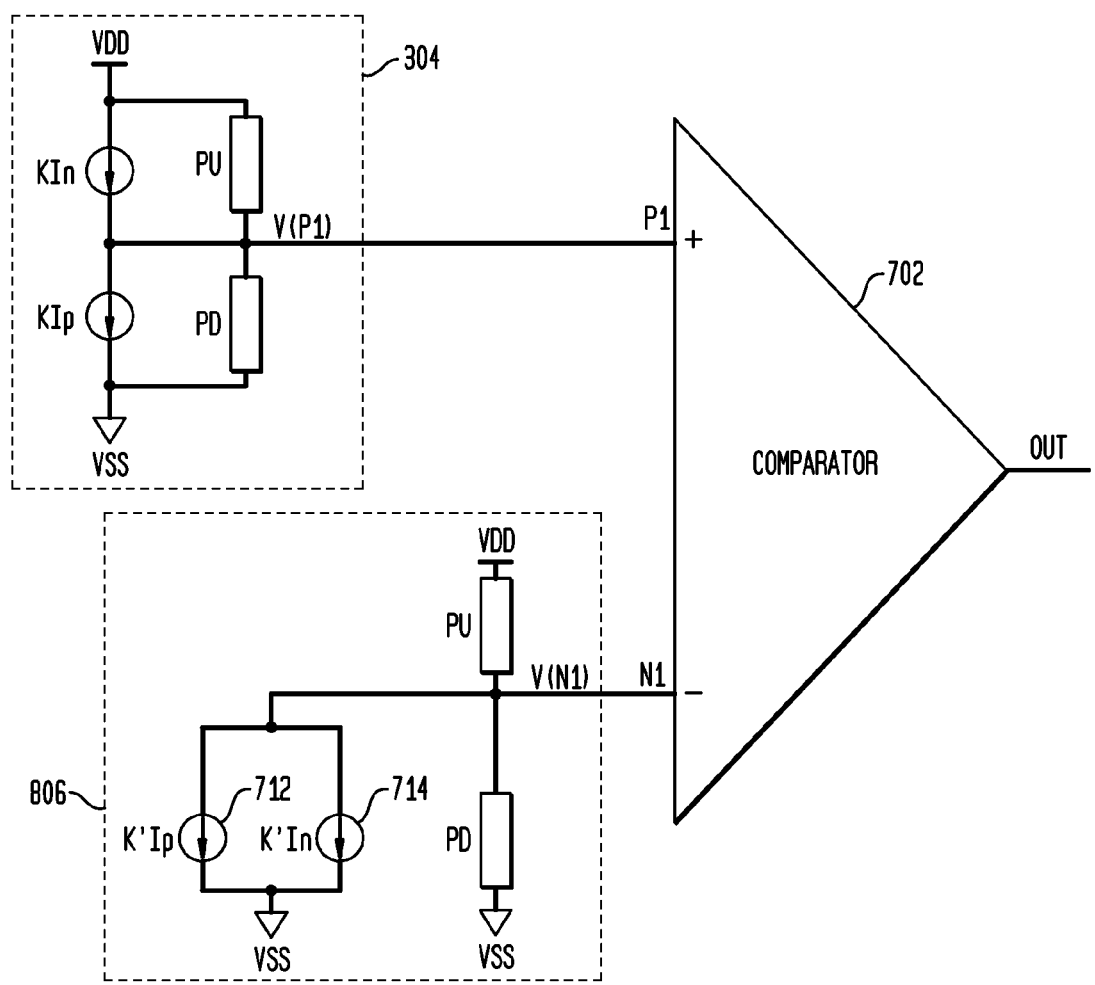
FIG. 8 is a schematic diagram depicting at least a portion of an exemplary comparison circuit, according to an embodiment of the present invention.

FIG. 8 is a schematic diagram depicting at least a portion of an exemplary comparison circuit 800, according to another embodiment of the invention. Consistent with comparison circuit 700 shown in FIG. 7, comparison circuit 800 includes a comparator 702 having a first input, which may be a non-inverting (+) input, connected with a first voltage generator circuit 304 at node P1, a second input, which may be an inverting (−) input, connected with a second voltage generator circuit 806 at node N1, and an output for generating an output signal, Out, indicative of a comparison between a voltage, V(P1), present at the first input and a voltage, V(N1), present at the second input. Comparison circuit 800 is essentially the same as comparison circuit 700 shown in FIG. 7 except that the polarity of the current offset, attributable to pull-up current source 712 and pull-down current source 714, in the second voltage generator circuit 806, is reversed relative to voltage generator circuit 706 shown in FIG. 7. In this manner, comparison circuit 800 is suitable for use in situations in which there is a negative impedance mismatch threshold.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1 through 8, or portions thereof, may be part of an integrated circuit. Integrated circuits so manufactured are considered part of this invention.

An integrated circuit in accordance with the present invention can be employed in essentially any application and/or electronic system in which a buffer circuit is utilized. Suitable systems for implementing techniques of the invention may include, but are not limited to, personal computers, communication networks, interface networks, high-speed memory interfaces (e.g., DDR3, DDR4), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A comparison circuit for detecting impedance mismatch between pull-up and pull-down devices in a circuit to be monitored, the comparison circuit comprising:
   a comparator operative to receive first and second signals and to generate, as an output of the comparison circuit, a third signal indicative of a difference between the first and second signals;
   a first signal generator connected with a first input of the comparator and operative to generate the first signal indicative of a difference between reference pull-up and pull-down currents that is scaled by a prescribed amount, the reference pull-up current being indicative of a current flowing through at least one corresponding pull-up transistor device in the circuit to be monitored, the reference pull-down current being indicative of a current flowing through at least one corresponding pull-down transistor device in the circuit to be monitored; and
   a second signal generator connected with a second input of the comparator and operative to generate the second signal as a reference voltage defining a prescribed impedance mismatch threshold associated with the circuit to be monitored.

2. The comparison circuit of claim 1, wherein the prescribed amount by which the difference between reference pull-up and pull-down currents is scaled is selected to be greater than an offset of the comparator.

3. The comparison circuit of claim 1, wherein the second signal generator is operative to generate the second signal indicative of a parallel combination of pull-up and pull-down impedances corresponding to the pull-up and pull-down transistor devices, respectively, in the circuit to be monitored.

4. The comparison circuit of claim 1, wherein the first signal comprises first and second signal components, the first signal component being indicative of scaled currents flowing through equivalent pull-up and pull-down impedances corresponding to the pull-up and pull-down transistor devices, respectively, in the circuit to be monitored, and the second signal component being indicative of a Thevenin equivalent voltage due to the pull-up and pull-down impedances.

5. The comparison circuit of claim 4, wherein the first and second signal components are combined using superposition to thereby generate the first signal.

6. The comparison circuit of claim 1, wherein the first signal generator comprises:
   a first pull-up device adapted for connection between a first voltage supply and the first input of the comparator, the first pull-up device operative to track at least one operating characteristic of the at least one corresponding pull-up device in the circuit to be monitored;
   a first pull-down device adapted for connection between a second voltage supply and the first input of the comparator, the first pull-down device operative to track at least one operating characteristic of the at least one corresponding pull-down device in the circuit to be monitored;
   a reference pull-up current source connected in parallel with the first pull-down device, the reference pull-up current source including at least a first current mirror comprising a second pull-up device operative to track at least one operating characteristic of the at least one corresponding pull-up device in the circuit to be monitored, the first current mirror having a first scaling factor associated therewith and operative to generate the reference pull-up current as a function of a first current flowing through the second pull-up device and the first scaling factor; and
   a reference pull-down current source connected in parallel with the first pull-up device, the reference pull-down current source including at least a second current mirror comprising a second pull-down device operative to track at least one operating characteristic of the at least one corresponding pull-down device in the circuit to be monitored, the second current mirror having a second scaling factor associated therewith and operative to generate the reference pull-down current as a function of a second current flowing through the second pull-down device and the second scaling factor.

7. The comparison circuit of claim 6, wherein the first and second scaling factors are equal.

8. The comparison circuit of claim 1, wherein the second signal generator comprises a resistive divider including a plurality of resistive elements connected in series between a voltage supply of the comparison circuit and ground, the second signal being generated as a voltage across at least one of the plurality of resistive elements in the resistive divider.

9. The comparison circuit of claim 1, wherein the second signal generator comprises:
   a first pull-up device adapted for connection between a first voltage supply and the second input of the comparator, the first pull-up device operative to track at least one operating characteristic of the at least one corresponding pull-up device in the circuit to be monitored;
   a first pull-down device adapted for connection between a second voltage supply and the second input of the comparator, the first pull-down device operative to track at least one operating characteristic the at least one corresponding pull-down device in the circuit to be monitored;
   a reference pull-up current source connected in parallel with the first pull-up device, the reference pull-up current source including at least a first current mirror comprising a second pull-up device operative to track at least one operating characteristic of the at least one corresponding pull-up device in the circuit to be monitored, the first current mirror having a first scaling factor associated therewith and operative to generate the reference pull-up current as a function of a first current flowing through the second pull-up device and the first scaling factor; and
   a reference pull-down current source connected in parallel with the first pull-up device, the reference pull-down current source including at least a second current mirror comprising a second pull-down device operative to track at least one operating characteristic of the at least one corresponding pull-down device in the circuit to be monitored, the second current mirror having a second scaling factor associated therewith and operative to generate the reference pull-down current as a function of a second current flowing through the second pull-down device and the second scaling factor.

10. The comparison circuit of claim 1, wherein the first signal generator comprises:
   a first pull-up device adapted for connection between a first voltage supply and the first input of the comparator, the first pull-up device operative to track at least one operating characteristic of the at least one corresponding pull-up device in the circuit to be monitored;
   a first pull-down device adapted for connection between a second voltage supply and the first input of the comparator, the first pull-down device operative to track at least one operating characteristic of the at least one corresponding pull-down device in the circuit to be monitored;
   a reference pull-up current source connected in parallel with the first pull-down device, the reference pull-up current source including at least a first current mirror comprising a second pull-up device operative to track at least one operating characteristic of the at least one corresponding pull-up device in the circuit to be monitored, the first current mirror having a first scaling factor associated therewith and operative to generate the reference pull-up current as a function of a first current flowing through the second pull-up device and the first scaling factor; and
   a reference pull-down current source connected in parallel with the first pull-up device, the reference pull-down current source including at least a second current mirror comprising a second pull-down device operative to track at least one operating characteristic of the at least one corresponding pull-down device in the circuit to be monitored, the second current mirror having the first scaling factor associated therewith and operative to generate the reference pull-down current as a function of a second current flowing through the second pull-down device and the first scaling factor.

11. The comparison circuit of claim 10, wherein the second signal generator comprises:

a first pull-up device adapted for connection between a first voltage supply and the second input of the comparator, the first pull-up device operative to track at least one operating characteristic of the at least one corresponding pull-up device in the circuit to be monitored;

a first pull-down device adapted for connection between a second voltage supply and the second input of the comparator, the first pull-down device operative to track at least one operating characteristic the at least one corresponding pull-down device in the circuit to be monitored;

a reference pull-up current source connected in parallel with the first pull-up device, the reference pull-up current source including at least a first current mirror comprising a second pull-up device operative to track at least one operating characteristic of the at least one corresponding pull-up device in the circuit to be monitored, the first current mirror having a second scaling factor associated therewith and operative to generate the reference pull-up current as a function of a first current flowing through the second pull-up device and the second scaling factor; and a reference pull-down current source connected in parallel with the first pull-up device, the reference pull-down current source including at least a second current mirror comprising a second pull-down device operative to track at least one operating characteristic of the at least one corresponding pull-down device in the circuit to be monitored, the second current mirror having the second scaling factor associated therewith and operative to generate the reference pull-down current as a function of a second current flowing through the second pull-down device and the second scaling factor;

wherein the first scaling factors is selected to obtain a desired scaling of measured impedance mismatch and the second scaling factor is selected to define a reference voltage against which the measured impedance mismatch is compared.

12. The comparison circuit of claim 1, wherein the comparator comprises a difference comparator.

13. The comparison circuit of claim 12, wherein the difference comparator is operative to receive first and second sets of differential signals and to generate, as an output of the comparison circuit, the third signal indicative of a difference between the first and second sets of differential signals, the second set of differential signals comprising the reference voltage defining the prescribed impedance mismatch threshold associated with the circuit to be monitored, the first set of differential signals comprising first and second signal components, the first signal component including (i) a voltage indicative of scaled currents flowing through equivalent pull-up and pull-down impedances corresponding to the pull-up and pull-down transistor devices, respectively, in the circuit to be monitored, and (ii) a first Thevenin equivalent voltage due to the pull-up and pull-down impedances, the second signal component comprising a second Thevenin equivalent voltage due to the pull-up and pull-down impedances, the second Thevenin equivalent voltage being substantially equal to the first Thevenin equivalent voltage such that the first and second Thevenin equivalent voltages substantially cancel one another in the first set of differential signals.

14. The comparison circuit of claim 12, wherein the difference comparator is operative to receive first and second sets of differential signals and to generate, as an output of the comparison circuit, the third signal indicative of a difference between the first and second sets of differential signals, the second set of differential signals comprising first and second signal components, and wherein the second signal generator comprises a resistive divider, each of the first and second signal components being indicative of a voltage of a corresponding node in the resistive divider.

15. The comparison circuit of claim 1, wherein the second signal generator comprises a programmable voltage source.

16. The comparison circuit of claim 1, wherein the second signal generated by the second signal generator is scaled by a same amount as the first signal generated by the first signal generator.

17. The comparison circuit of claim 1, wherein the circuit to be monitored comprises a buffer circuit.

18. The comparison circuit of claim 1, wherein the third signal generated by the comparator is operative to control an impedance of at least one of one or more pull-up devices and one or more pull-down devices in the circuit to be modified to thereby reduce impedance mismatch between the pull-up and pull-down devices in a circuit to be monitored.

19. An electronic system, comprising:
at least one integrated circuit, the at least one integrated circuit including at least one comparison circuit for detecting impedance mismatch between pull-up and pull-down devices in a circuit to be monitored, the at least one comparison circuit comprising:
a comparator operative to receive first and second signals and to generate, as an output of the comparison circuit, a third signal indicative of a difference between the first and second signals;
a first signal generator connected with a first input of the comparator and operative to generate the first signal indicative of a difference between reference pull-up and pull-down currents that is scaled by a prescribed amount, the reference pull-up current being indicative of a current flowing through at least one corresponding pull-up transistor device in the circuit to be monitored, the reference pull-down current being indicative of a current flowing through at least one corresponding pull-down transistor device in the circuit to be monitored; and
a second signal generator connected with a second input of the comparator and operative to generate the second signal as a reference voltage defining a prescribed impedance mismatch threshold associated with the circuit to be monitored.

20. A comparison circuit for detecting impedance mismatch between pull-up and pull-down devices in a circuit to be monitored, the comparison circuit comprising:
a comparator operative to receive first and second signals and to generate, as an output of the comparison circuit, a third signal indicative of a difference between the first and second signals;
a first signal generator connected with a first input of the comparator and operative to generate the first signal indicative of a difference between reference pull-up and pull-down currents that is scaled by a prescribed amount, the reference pull-up current being indicative of a current flowing through at least one corresponding pull-up transistor device in the circuit to be monitored, the reference pull-down current being indicative of a current flowing through at least one corresponding pull-down transistor device in the circuit to be monitored, the first signal generator comprising: a reference pull-up current source connected in parallel with a first pull-down device coupled between a first voltage supply and a second input of the comparator; and a reference pull-down current source connected in parallel with a first pull-up device coupled between a second voltage supply and the first input of the comparator; and a second signal generator connected with the second input of the comparator and operative to generate the second signal as a reference voltage defining a prescribed impedance mismatch threshold associated with the circuit to be monitored.

* * * * *